(12) United States Patent
Kim

(10) Patent No.: US 9,520,383 B2
(45) Date of Patent: Dec. 13, 2016

(54) LIGHT EMITTING DEVICE PACKAGE AND LIGHTING SYSTEM

(75) Inventor: Kyong Jun Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 227 days.

(21) Appl. No.: 13/076,712

(22) Filed: Mar. 31, 2011

(65) Prior Publication Data

US 2011/0211348 A1 Sep. 1, 2011

(30) Foreign Application Priority Data

Apr. 1, 2010 (KR) .................. 10-2010-0030018

(51) Int. Cl.
*H01L 25/075* (2006.01)
*H01L 33/64* (2010.01)
*F21Y 101/00* (2016.01)

(52) U.S. Cl.
CPC ............. *H01L 25/0753* (2013.01); *F21K 9/23* (2016.08); *F21Y 2101/00* (2013.01); *F21Y 2105/10* (2016.08); *F21Y 2115/10* (2016.08); *H01L 33/64* (2013.01); *H01L 2224/48091* (2013.01); *H01L 2224/48137* (2013.01); *H01L 2224/48247* (2013.01); *H01L 2924/00014* (2013.01); *H01L 2924/3025* (2013.01)

(58) Field of Classification Search
CPC ........ F21S 4/001; F21S 4/003; F21W 2121/00; A41D 27/085; A42B 1/242; G09F 21/02
USPC ............................................ 362/249.01, 800
See application file for complete search history.

(56) References Cited

U.S. PATENT DOCUMENTS

| | | | | |
|---|---|---|---|---|
| 5,841,177 A | * | 11/1998 | Komoto et al. | ............... 257/431 |
| 6,375,340 B1 | | 4/2002 | Biebl et al. | |
| 7,170,100 B2 | | 1/2007 | Erchak et al. | |
| 7,696,590 B2 | * | 4/2010 | Waitl et al. | .................... 257/434 |
| 7,846,754 B2 | * | 12/2010 | Oh et al. | .......................... 438/29 |
| 7,932,525 B2 | | 4/2011 | Osamu | |
| 8,226,257 B2 | * | 7/2012 | Ye et al. | ...................... 362/97.1 |
| 8,530,917 B2 | * | 9/2013 | Kazama | .............. H01L 33/0079 |
| | | | | 257/98 |
| 2002/0004251 A1 | | 1/2002 | Roberts et al. | |
| 2004/0217369 A1 | | 11/2004 | Nitta et al. | |
| 2007/0013057 A1 | * | 1/2007 | Mazzochette | ................. 257/723 |
| 2007/0029564 A1 | | 2/2007 | Han et al. | |
| 2007/0063647 A1 | | 3/2007 | Yu | |
| 2008/0170391 A1 | | 7/2008 | Norfidathul et al. | |
| 2009/0057857 A1 | * | 3/2009 | Kaneda | ......................... 257/676 |
| 2009/0129079 A1 | | 5/2009 | Grotsch et al. | |
| 2009/0236618 A1 | | 9/2009 | Yasuda | |

(Continued)

FOREIGN PATENT DOCUMENTS

| | | |
|---|---|---|
| CN | 1102467 A | 5/1995 |
| CN | 101164170 A | 4/2008 |

(Continued)

*Primary Examiner* — Jong-Suk (James) Lee
*Assistant Examiner* — Mark Tsidulko
(74) *Attorney, Agent, or Firm* — Birch, Stewart, Kolasch & Birch, LLP

(57) ABSTRACT

Disclosed is a light emitting device package and a lighting system. The light emitting device package includes a body, a first lead frame on the body, a plurality of light emitting diodes on the first lead frame, and a molding member on the light emitting diodes. The distance between the light emitting diodes includes a distance equal to or less than a length of a first side of a first light emitting diode of the light emitting diodes.

21 Claims, 14 Drawing Sheets

(56) References Cited

U.S. PATENT DOCUMENTS

| | | |
|---|---|---|
| 2009/0242908 A1 | 10/2009 | Liao et al. |
| 2009/0262532 A1* | 10/2009 | Wilcox et al. ................ 362/248 |
| 2009/0283781 A1 | 11/2009 | Chan et al. |
| 2009/0284130 A1 | 11/2009 | Tsuji et al. |
| 2010/0038655 A1* | 2/2010 | Chen et al. ..................... 257/88 |
| 2010/0110686 A1* | 5/2010 | Li et al. ................... 362/249.06 |
| 2010/0244731 A1* | 9/2010 | Kaihotsu et al. ............. 315/294 |
| 2011/0019126 A1* | 1/2011 | Choi et al. ...................... 349/61 |

FOREIGN PATENT DOCUMENTS

| | | |
|---|---|---|
| CN | 101315963 A | 12/2008 |
| JP | 5-338262 A | 12/1993 |
| JP | 9-298314 A | 11/1997 |
| JP | 2000-89693 A | 3/2000 |
| JP | 2002-314143 A | 10/2002 |
| JP | 2002-539623 A | 11/2002 |
| JP | 2004-214338 A | 7/2004 |
| JP | 2005-109212 A | 4/2005 |
| JP | 2007-180163 A | 7/2007 |
| JP | 2008-192928 A | 8/2008 |
| JP | 2009-302077 A | 12/2009 |
| JP | 2010-27514 A | 2/2010 |
| KR | 10-2009-0064717 A | 6/2009 |
| KR | 10-2009-0104511 A | 10/2009 |

\* cited by examiner

LIGHT EMITTING DEVICE PACKAGE AND LIGHTING SYSTEM

The present application claims priority of Korean Patent Application No. 10-2010-0030018 filed on Apr. 1, 2010, which is hereby incorporated by reference in its entirety.

BACKGROUND

The embodiment relates to a light emitting device package and a lighting system.

Light emitting diodes (LEDs) can constitute a light source to generate light by using GaAs, AlGaAs, GaN, InGaN, and InGaAlP-based compound semiconductor materials.

The LED is packaged to constitute a light emitting device to express various colors, and the light emitting device has been used as a light source in various fields such as a lighting indicator producing various colors, a character indicator, and an image indicator.

SUMMARY

The embodiment provides a light emitting device package capable of reducing thermal interference between light emitting devices.

The embodiment provides a light emitting device package capable of improving heat radiation efficiency by setting a distance between light emitting devices provided on one lead frame within a predetermined range.

According to the embodiment, a light emitting device package includes a body, a first lead frame on the body, a plurality of light emitting diodes on the first lead frame, and a molding member on the light emitting diodes. A distance between the light emitting diodes includes a distance equal to or less than a length of a first side of a first light emitting diode of the light emitting diodes.

According to the embodiment, a light emitting device package includes a body including a cavity having an open upper portion, first and second lead frames in the cavity of the body, a first light emitting diode on the first lead frame, a second light emitting diode spaced apart from the first light emitting diode with a first distance on the first lead frame, and a molding member covering the first and second light emitting diodes. The first distance is equal to or less than a length of a shorter side of the first light emitting diode.

According to the embodiment, a lighting system includes a plurality of light emitting device packages, a board on which the light emitting device packages are disposed, and an optical member disposed on an optical path of the light emitting device package. At least one of the light emitting device packages includes a body, a first lead frame on the body, a plurality of light emitting diodes on the first lead frame, and a molding member on the light emitting diode. A distance between the light emitting diodes is equal to or less than a length of at least one side of the first light emitting diode.

BRIEF DESCRIPTION OF THE DRAWINGS

FIGS. 10A to 14B are views showing the thermal distribution of a lead frame according to the operation of a light emitting diode in a light emitting device package of FIG. 1;

DETAILED DESCRIPTION OF THE EMBODIMENTS

Figure 1:
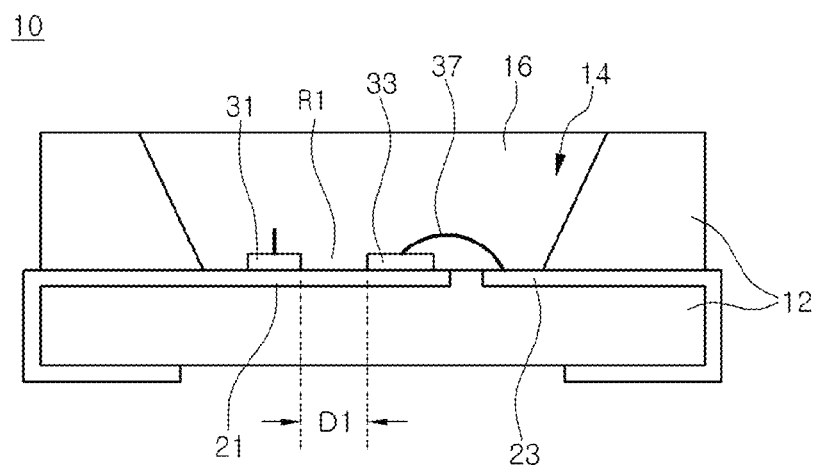
FIG. 1 is a side sectional view showing a light emitting device package according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
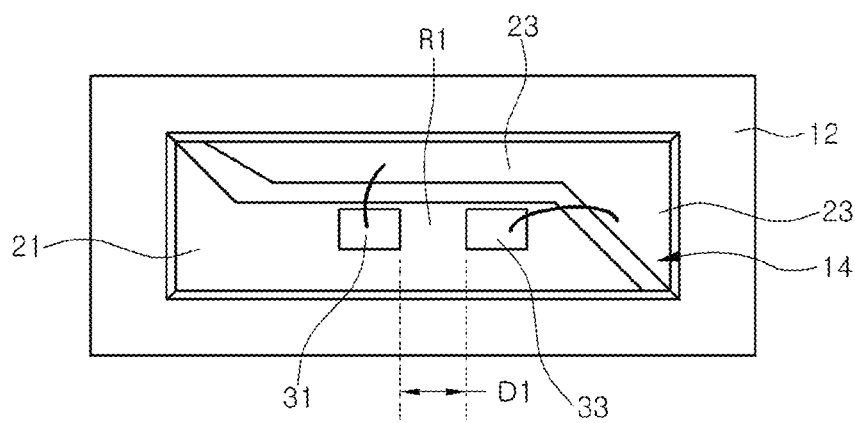
FIG. 2 is a plan view of FIG. 1.

FIG. 1 is a side sectional view showing a light emitting device package 10 according to a first embodiment, and FIG. 2 is a plan view of FIG. 1.

Referring to FIGS. 1 and 2, the light emitting device package 10 includes a body 12, a cavity 14, a plurality of lead frames 21 and 23 and a plurality of light emitting diodes 31 and 33.

The body 12 may include one of silicon material, ceramic material, and resin material. For example, the body 12 may include at least one selected from the group consisting of silicon, SIC (Silicon Carbide), AlN (Aluminum Nitride), PPA (Polyphthalamide), and LCP (Liquid Crystal Polymer), but the embodiment is not limited thereto. The body 12 may include a substrate of a single layer structure or a multiple layer structure, and may be injection-molded, but the embodiment is not limited thereto.

The body 12 includes the cavity 14 having an open upper portion. The cavity 14 may have a concave cup shape or a concave tube shape having a predetermined curvature. The surface of the cavity 14 may have a circular shape or a polygonal shape, but the embodiment is not limited thereto. A side portion of the cavity 14 may be formed of a different material from the body 12.

A periphery surface of the cavity 14 may be inclined with respect to an axis perpendicular to a bottom surface of the cavity 14, but the embodiment is not limited thereto.

First portions of the lead frames 21 and 23 may be spaced apart from each other in the cavity 14, and second portions of the lead frames 21 and 23 may be exposed out of the body 12. Lower surfaces of the first portions of the lead frames 21 and 23 may be spaced apart from a lower surface of the body 12.

The lead frames 21 and 23 may have a lead frame type, a metallic thin film type, or a copper layer type of a PCB (Printed Circuit Board). Hereinafter, the lead frames 21 and 23 having a lead frame type will be representatively described for the purpose of explanation. The thickness of the lead frames 21 and 23 may be within the range of about 0.1 mm to about 0.5 mm. Preferably, the thickness of the lead frames 21 and 23 may be within the range of about 0.1 mm to about 0.2 mm. The lead frames 21 and 23 may have various thicknesses according to heat radiation efficiency and a package type.

The light emitting diodes 31 and 33 are attached to the first lead frame 21 through an adhesive agent, and are electrically connected to the lead frames 21 and 23 by using a wire 37. According to another embodiment, the light emitting diodes 31 and 33 may be mounted through a wire bonding scheme, a die bonding scheme, or a flip bonding scheme, but the embodiment is not limited thereto.

The light emitting diodes 31 and 33 may be connected to the lead frames 21 and 23 in parallel or in series. The connection scheme of the light emitting diodes 31 and 33 may vary according to a chip type, the number of the lead frames, and the arrangement of the light emitting diodes 31 and 33. In addition, the light emitting diodes 31 and 33 may be mounted on the first lead frame 21 by using a die paste, and the die paste may include conductive material.

The light emitting diodes 31 and 33 may include LED chips including compound semiconductors of group III and V elements. For example, the light emitting diodes 31 and 33 may include LED chips including an AlInGaN, InGaN, GaN, GaAs, InGaP, AlInGaP, InP, or InGaAs-based semiconductor.

At least one of the light emitting diodes 31 and 33 may include a blue LED chip, a yellow LED chip, a green LED chip, a red LED chip, an UV LED chip, an amber-colored LED chip, or a blue-green LED chip. The number and the type of the light emitting diodes 31 and 33 provided in the cavity 14 may vary. The light emitting diodes 31 and 33 may include LED chips to emit lights having different color wavelength bands or an LED chip to emit light having the same color wavelength band, but the embodiment is not limited thereto.

A molding member 16 is disposed on the cavity 14 and covers the light emitting diodes 31 and 33.

The molding member 16 may include transmissive resin such as silicon or epoxy. The surface of the molding member 16 may have a flat shape, a concave shape or a convex shape. The molding member 16 may include at least one type of luminescence material. The luminescence material may include at least one of YAG, TAG, Silicate, Nitride, and Oxynitride-based materials.

A lens (not shown) may be formed on the molding member 16. The lens may selectively include a concave lens and/or a convex lens according to the functions and the light distribution.

The light emitting device package 10 includes the light emitting diodes 31 and 33 to improve light intensity. The light emitting diodes 31 and 33 may be mounted on the first lead frame 21 of the lead frames 21 and 23. In the light emitting device package 10, the light emitting diodes 31 and 33 are mounted on the first lead frame 21, so that radiation of heat emitted from the light emitting diodes 31 and 33 should be effectively performed. According to the embodiment, a distance D1 between the light emitting diodes 31 and 33 mounted on the first lead frame is optimized. The distance D1 may be designed by taking into consideration the type of an LED chip and the die paste.

The light emitting diodes 31 and 33 may be adjacent to each other, and the distance D1 between the light emitting diodes 31 and 33 may be set to the extent that the mutual interference caused by heat emitted from the light emitting diodes 31 and 33 does not exert on the operation of each of the light emitting diodes 31 and 33, or may be set to the minimum distance to smoothly radiate the heat emitted from each of the light emitting diodes 31 and 33. The most of mutual interference is generated on a region R1 of between the light emitting diodes 31 and 33 by the heats emitted from the light emitting diodes 31 and 33.

According to the embodiment, the distance D1 between the light emitting diodes 31 and 33 may be within the range of about 250 μm±50 μm. Preferably, the distance D1 between a first side 32 of diode 31 and a second side 34 of diode 34 may be within the range of about 220 μm to about 280 μm. The distance D1 between the light emitting diodes 31 and 33 allows the light emitting diodes 31 and 33 to represent the temperature characteristic substantially identical to or similar to that of one light emitting diode 31 mounted on one lead frame 21. The distance D1 between the light emitting diodes 31 and 33 may be the minimum of a distance set to the extent that the mutual interference caused by heats emitted from the two adjacent light emitting diodes 31 and 33 does not exert on the operation of each of the light emitting diodes 31 and 33. The mutual interference generated in a region R1 of between the light emitting diodes 31 and 33 is decreased by the distance D1 between the light emitting diodes 31 and 33.

If the distance D1 between the light emitting diodes 31 and 33 is increased, the body 12 must be enlarged or the space of the cavity 14 may be expanded. In addition, color separate may occur or irregular brightness on the light emitting module in which a plurality of light emitting device packages are provided. If the distance D1 between the light emitting diodes 31 and 33 is narrower than the minimum distance, the heat radiation efficiency of the light emitting diodes 31 and 33 may be degraded, and the operating characteristics of the light emitting diodes 31 and 33 may be degraded due to the heat interference between the light emitting diodes 31 and 33, so that the reliability for the light emitting device package 10 may be degraded.

As shown in FIG. 2, one side surface of the first light emitting diode 31 is provided corresponding to an one side surface of the second light emitting diode 33, but the embodiment is not limited thereto. According to another embodiment, vertexes (or corners) of the first and second light emitting diodes 31 and 33 may be arranged corresponding to each other. In addition, a vertex (or corner) of the first light emitting diode 31 may be arranged corresponding to an one side of the second light emitting diode 33, or a vertex (or corner) of the second light emitting diode 33 may be arranged corresponding to an one side of the first light emitting diode 31. In such an arrangement structure, the distance between the first and second light emitting diodes 31 and 33 may satisfy the range of about 250 µm±50 µm. The distance satisfying the range condition may be the minimum of a distance.

Figure 3:
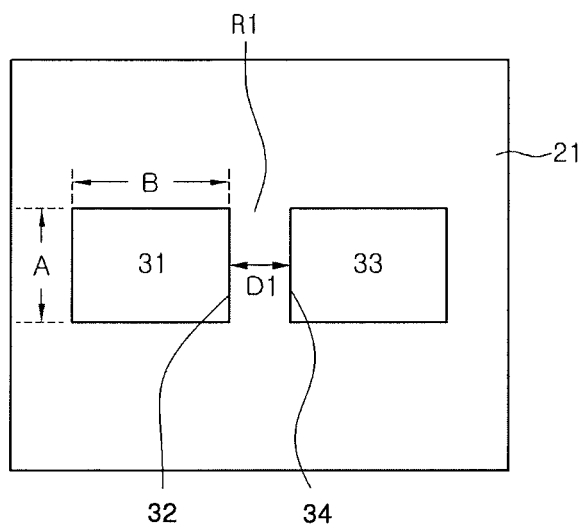
FIG. 3 is a view showing the distance of two light emitting diodes mounted on the first lead frame of FIG. 1.

FIG. 3 is a view showing the arrangement of two light emitting diodes 31 and 33 mounted on the first lead frame 21 of FIG. 1.

Referring to FIG. 3, the light emitting diodes 31 and 33 mounted on the first lead frame 21 may have the same size or different sizes. Hereinafter, the light emitting diodes 31 and 33 having the same size will be representatively described. In addition, the light emitting diodes 31 and 33 may have a width B and a length A, and the width B may be identical to or different from the length A, but the embodiment is not limited thereto.

The distance D1 between the light emitting diodes 31 and 33 may be smaller than the size of the width B and/or the length A of the light emitting diodes 31 and 33. For example, if the light emitting diodes 31 and 33 have 300 µm×300 µm in (the length A)×(the width B), the distance D1 may be at least smaller than about 300 µm. If the light emitting diodes 31 and 33 have 500 µm×400 µm or 500 µm×300 µm in (the length A)×(the width B), the distance D1 may be at least smaller than the size of a shorter side of length and width sides. If the light emitting diodes 31 and 33 have 250 µm×300 µm in (the length A)×(the width B), the distance D1 may be different from the size of a shorter side of length and width sides, that is, may be greater than or smaller than the size of the shorter side.

Figure 4:
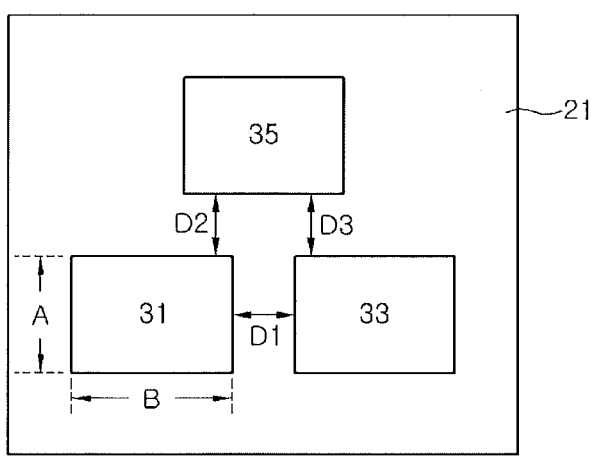
FIG. 4 shows a distance between two light emitting diodes among three light emitting diodes arranged on one lead frame according to a second embodiment.

FIG. 4 shows a case in which three light emitting diodes 31, 33, and 35 are arranged on the first lead frame 21. The three light emitting diodes 31, 33, and 35 may be arranged in two rows. The first and second light emitting diodes 31 and 33 may be arranged in a first direction, and the third light emitting diode 35 may be arranged in a row spaced apart from an arrangement row of the first and second light emitting diodes 31 and 33. A side of the first light emitting diode 31 substantially faces a side of the second light emitting diode 33. The center of the third light emitting diode 35 may be provided between the first and second light emitting diodes 31 and 33. The three light emitting diodes 31, 33, and 35 may have a triangular structure, but the embodiment is not limited thereto.

The three light emitting diodes 31, 33, and 35 may have the same size, and may emit lights having the same color wavelength band or lights having different color wavelength bands.

Distances D1, D2, and D3 two light emitting diodes among the three light emitting diodes 31, 33, and 35 may be provided within a critical range. For example, the distances D1, D2, and D3 may be provided within the range of about 250 µm±50 µm. In this case, the distance D1 may be provided between the first and second light emitting diodes 31 and 33, and the distance D2 may be provided between the first and third light emitting diodes 31 and 35. The distance D3 may be provided between the second and third light emitting diodes 33 and 35. Although each distance is provided between side surfaces of two light emitting diodes according to the embodiment for the purpose of explanation, the embodiment is not limited thereto.

The three light emitting diodes 31, 33, and 35 may have the same size or different sizes in the width B and the length A, but the embodiment is not limited thereto. The distances D1, D2, and D3 between two light emitting diodes among the light emitting diodes 31, 33, and 35 may be shorter than the length of one side (A or B) of the light emitting diodes 31, 33, and 35. In other words, the distances D1, D2, and D3 may be at least shorter than the length of a shorter side. The distance D2 or D3 are identical or similar to the distance D1 between the first and second light emitting diodes 31 and 33 according to a first embodiment. Preferably, the distances D1, D2, and D3 between two light emitting diodes among the light emitting diodes 31, 33, and 35 are identical or similar from each other.

Figure 5:
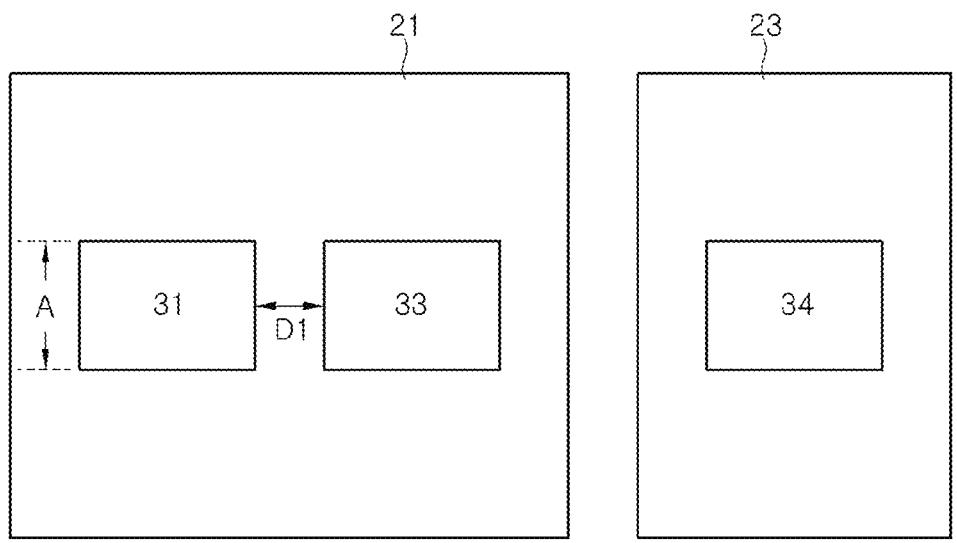
FIG. 5 is a view showing that three light emitting diodes are mounted on two lead frames according to a third embodiment.

FIG. 5 is a view showing that three light emitting diodes are mounted on two lead frames according to the embodiment. Referring to FIG. 5, the first and second light emitting diodes 31 and 33 are provided on the first lead frame 21 while being spaced apart from each other at a predetermined distance D1, and a third light emitting diode 34 is provided on the second lead frame 23. Although the third light emitting diode 34 is additionally provided on the second lead frame 23, the distance D1 between the first and second light emitting diodes 31 and 33 mounted on the first lead frame 21 may be within the range of about 250 µm±50 µm.

In this case, the distance between the second and third light emitting diodes 33 and 34 may be at least wider than the distance D1.

Figure 6:
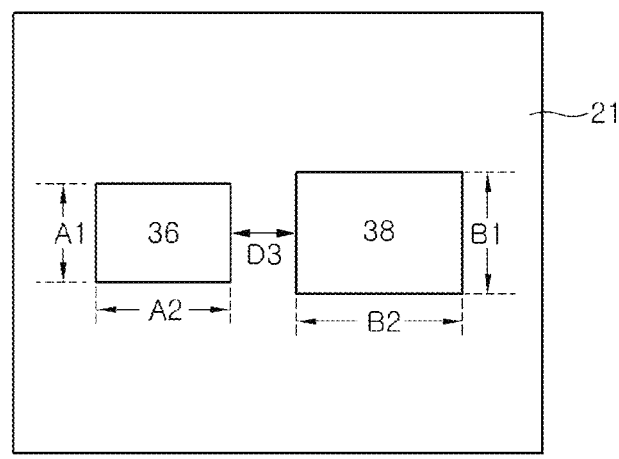
FIG. 6 is a view showing a distance between light emitting diodes having different sizes mounted on one lead frame according to a fourth embodiment.

FIG. 6 is a view showing that light emitting diodes having different sizes are mounted on one lead frame according to a fourth embodiment.

Referring to FIG. 6, first and second light emitting diodes 36 and 38 are mounted on the first lead frame 21. The width A2 and the length A1 of the first light emitting diode 36 is at least 1 mm shorter than the width B2 and the length B1 of the second light emitting diode 38. The width A2 of the first light emitting diode 36 may be different from the length A1 of the first light emitting diode 36. For example, the length A2 may be at least 1 µm greater than the width A1.

The distance D3 between the first light emitting diode 36 and the second light emitting diode 38 may be at least ¼ of the length of a shorter side of a smaller light emitting diode of the two light emitting diodes 36 and 38. The distance D3 may be set with the range of A1/4 to A1. The D3 may be set within the range to minimize the thermal interference between the first and second light emitting diodes 36 and 38 or minimize the influence exerted on the operation of the first and second light emitting diodes 36 and 38. In this case, the length A2 may be set to at least 250 µm, and the length A1 may be set to less than four times of the distance D3.

Figure 7:
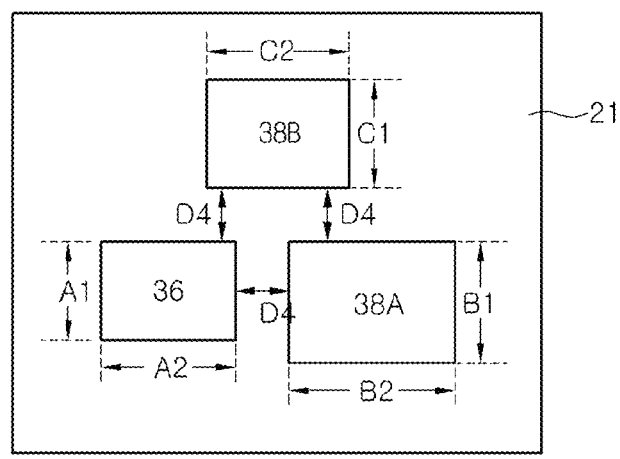
FIG. 7 is a view showing distances between two light emitting diodes among three light emitting diodes mounted on one lead frame according to a fifth embodiment.

FIG. 7 is a view showing distances between three light emitting diodes mounted on one lead frame according to a fifth embodiment.

Referring to FIG. 7, a first light emitting diode 36 is the smallest light emitting diode among three light emitting diodes 36, 38A and 38B.

The length A2 and the length A1 of the first light emitting diode 36 may be at least 1 mm smaller than the length B2 and the length B1 of the second light emitting diode 38A, respectively, and may be at least 1 mm smaller than the length C2 and the length C1 of the third light emitting diode 38B. The length A2 of the first light emitting diode 36 may be different from the length A1 of the first light emitting diode 36. For example, the length A2 may be at least 1 µm greater than the length A1.

The distance D4 between the first and second light emitting diodes 36 and 38A may be at least smaller than the length A1 of the first light emitting diode 36. For example, the distance D4 may satisfy the range of A1/4 to A1.

The distances D4 between two light emitting diodes among the first to third light emitting diodes 36, 38A, and 38B may be identical to each other or different from each other. Preferably, the distances D4 may satisfy the range of A1/4 to A1. In this case, the length A1 may be set to at least 250 μm, or may be set to at less than four times of the distance D4.

Figure 8:
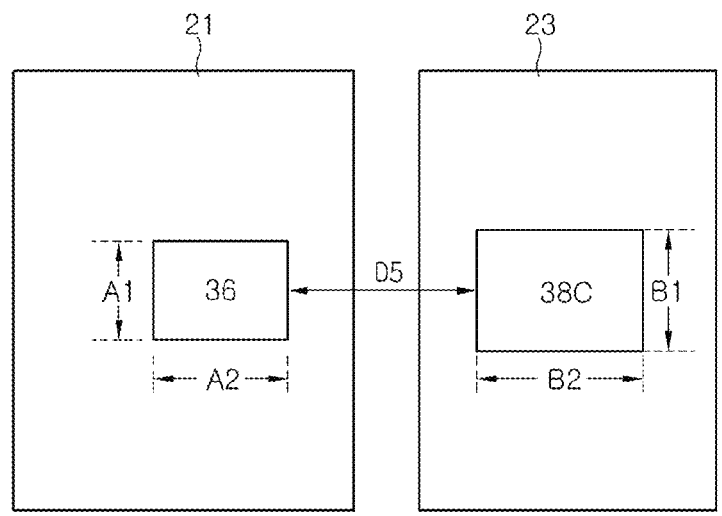
FIG. 8 is a view showing the distance between light emitting diodes having different size and mounted on two lead frames according to a sixth embodiment.

FIG. 8 is a view showing the distance between light emitting diodes having different size and mounted on two lead frames according to a sixth embodiment.

Referring to FIG. 8, the first light emitting diode 36 is mounted on the first lead frame 21, and the second light emitting diode 38C is mounted on the second lead frame 23. The length A2 and length A1 of the first light emitting diode 36 may be at least shorter than the length B2 and the length B1 of the second light emitting diode 38C.

The length A2 of the first light emitting diode 36 may be different from the length A1 of the first light emitting diode 36. For example, the length A2 may be at least 1 μm greater than the length A1.

The distance D4 between the first and second light emitting diodes 36 and 38C may be smaller than the size of a shorter side (length A1) of the first light emitting diode 36. Preferably, the distance D5 may satisfy the range of A1/3 to A1. In this case, the length A1 may be set to at least 250 μm, or may be set to at less than three times of the distance D5.

In addition, since the first and second light emitting diodes 36 and 38C are mounted on different lead frames 21 and 23, respectively, the thermal interference between the two light emitting diodes 36 and 38C may be lower than the thermal interference between the two light emitting diodes 36 and 38C when the first and second light emitting diodes 36 and 38C are mounted on one lead frame. Accordingly, the distance D5 may be longer than the distance D3 of FIG. 6.

Figure 9:
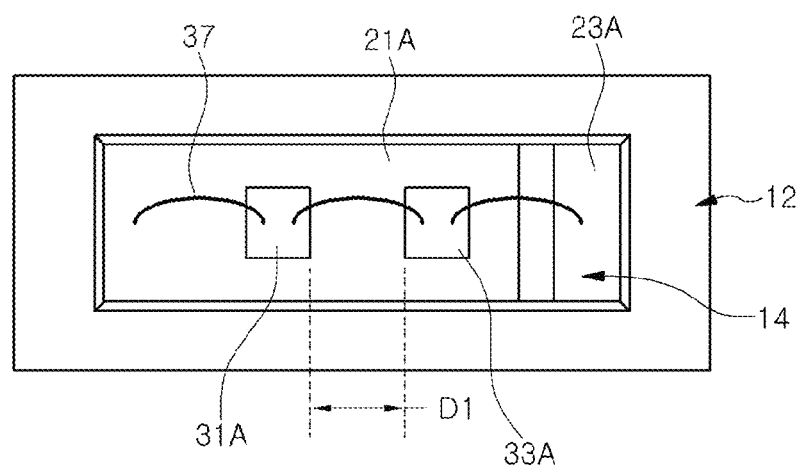
FIG. 9 is a plan view showing a light emitting device package according to a seventh embodiment.
Figure 10:
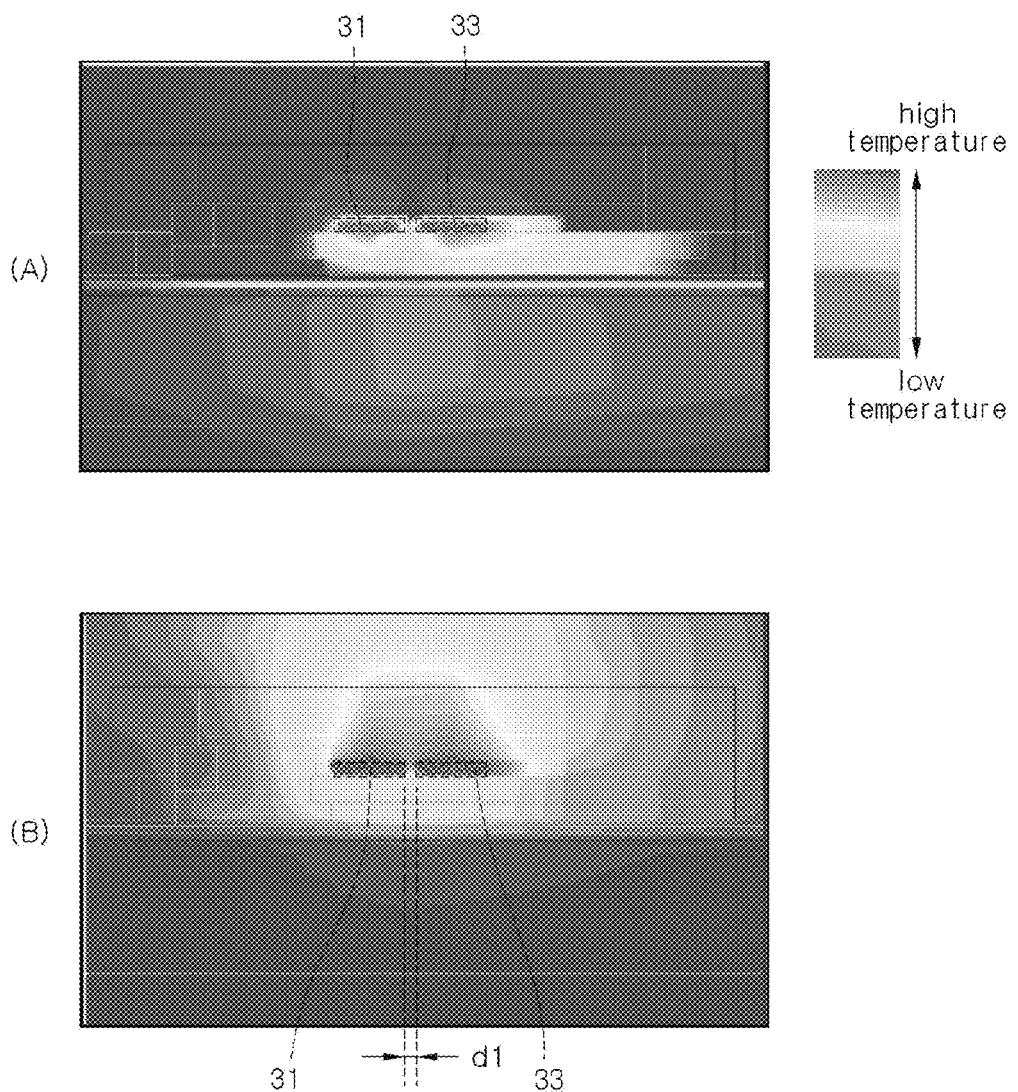
Figure 11:
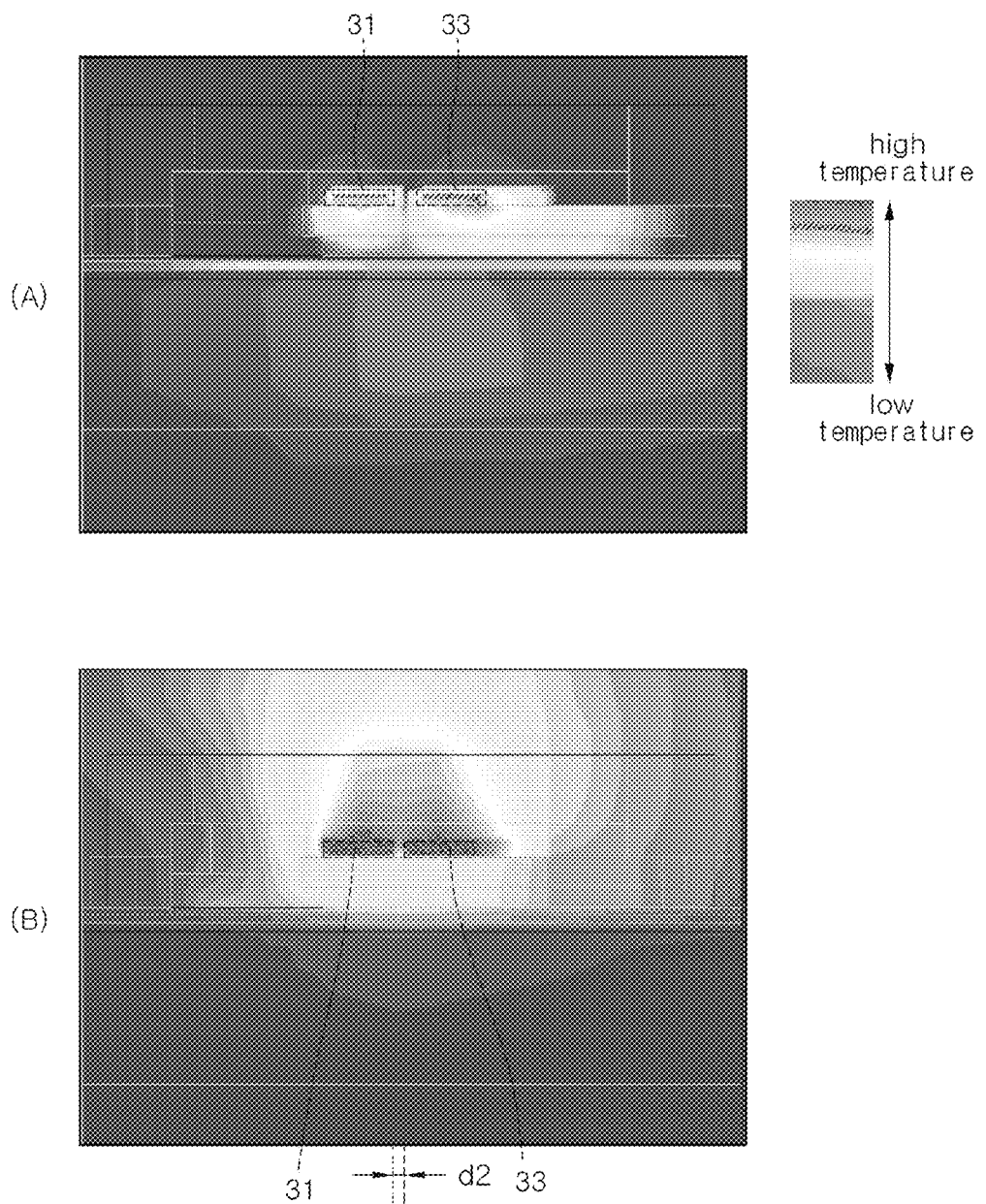
Figure 12:
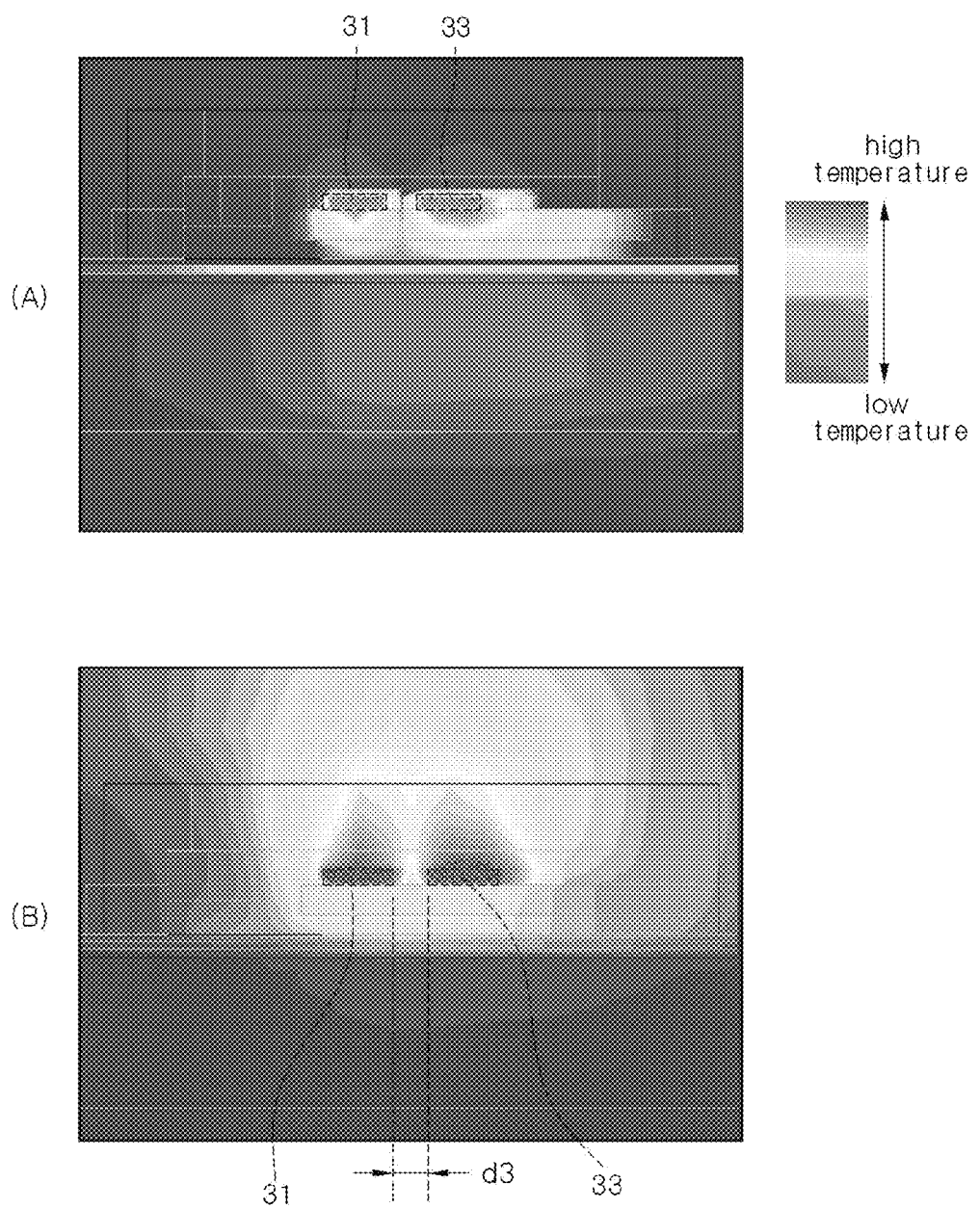
Figure 13:
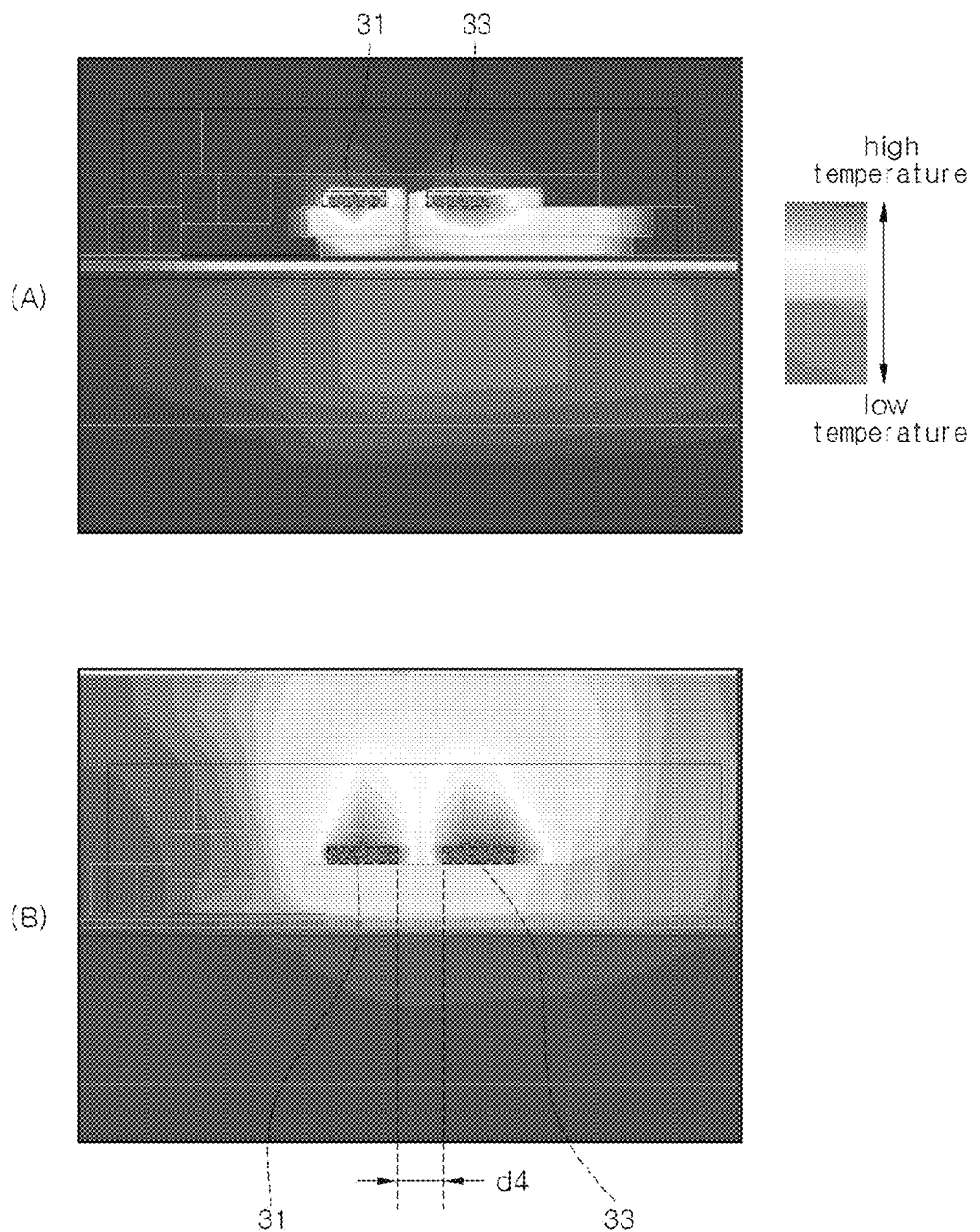
Figure 14:
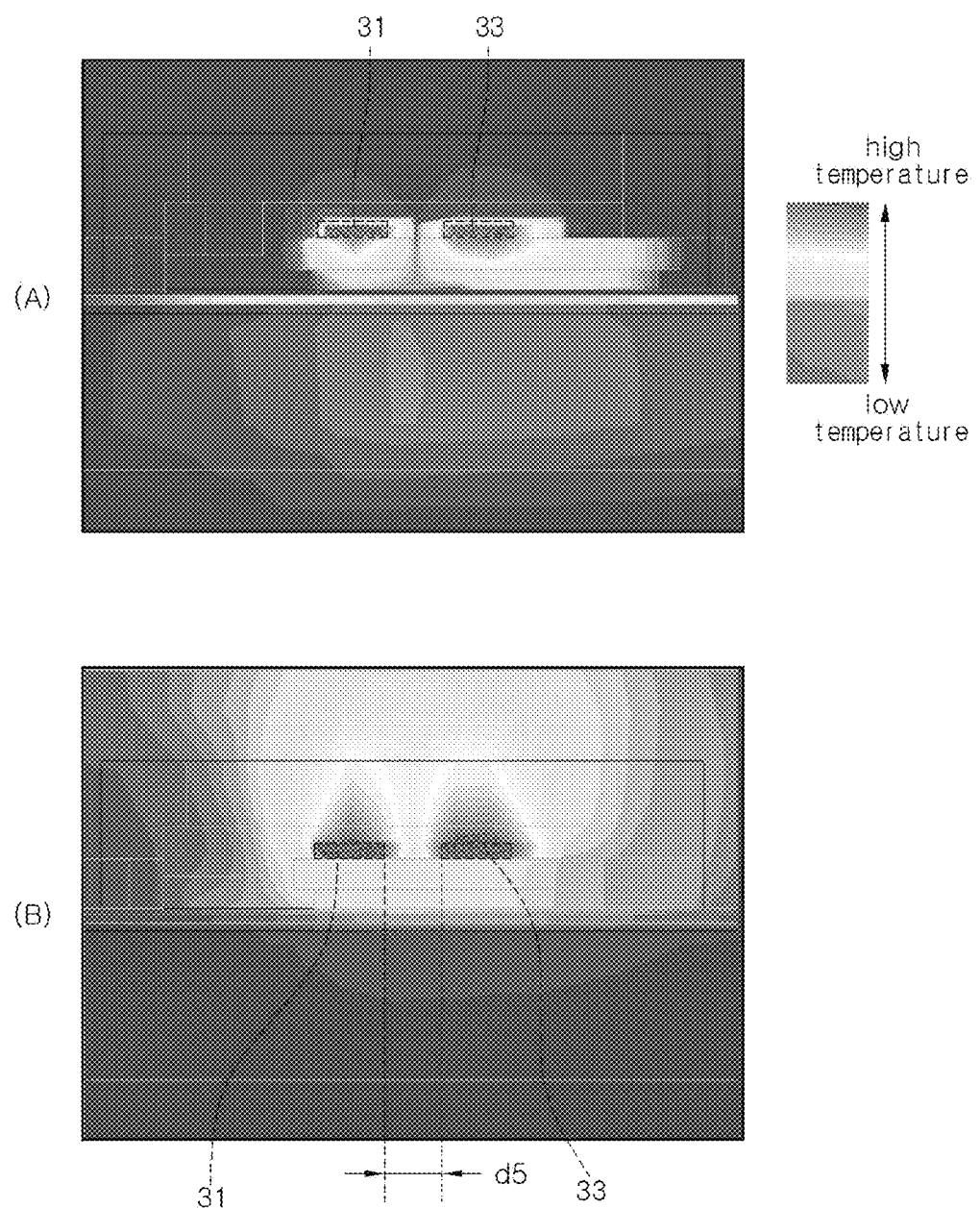

FIG. 9 is a plan view showing a light emitting device package according to a seventh embodiment. Hereinafter, the seventh embodiment will be described while focusing on the difference from the first embodiment, and the structure and components identical to those of the first embodiment will not be further described.

Referring to FIG. 9, a plurality of light emitting diodes 31A and 33A are provided on a first lead frame 21A, and connected to the first lead frame 21A and a second lead frame 23A in series. The first light emitting diode 31A is connected to the first lead frame 21A and the second light emitting diode 33A by using the wire 37. The second light emitting diode 33A is connected to the first light emitting diode 31A and the second lead frame 23A by using the wire 37.

The distance D1 between the first and second light emitting diodes 31A and 33A is the minimum distance set by taking into consideration the thermal characteristic between two adjacent light emitting diodes. For example, the distance D1 may be set within the range of 250 μm±50 μm.

Although a top view type light emitting device package is shown and described according to the embodiment, a side view type light emitting device package can be realized to improve the thermal characteristic. In addition, light intensity of a light emitting device package having a plurality of light emitting diodes is improved. Further, when a plurality of light emitting device packages of the plurality of light emitting diodes are arranged on a board, the interval between the light emitting device packages may be wider than a interval between a light emitting device packages having a light emitting diode.

FIGS. 10A to 14B are views showing the thermal characteristic in the structure of the light emitting device package of FIG. 1. FIGS. 10A, 11A, 12A, 13A, and 14A represent thermal characteristics measured under a lead frame, and FIGS. 10B, 11B, 12B, 13B, and 14B represent thermal characteristic measured above a lead frame. In these cases, in order to measure thermal characteristic data, a light emitting diode has a size of at least 300 μm×300 μm, a current is a rated current (e.g., at least 20 mA) suitable for the light emitting diode, and a body and lead frames have the structure of FIG. 1.

FIGS. 10A and 10B show a case in which the distance d1 of the light emitting diodes is about 100 μm. As shown in FIGS. 10A and 10B, mutual interference occurs between heats emitted from the light emitting diodes 31 and 33 provided on one lead frame.

FIGS. 11A and 11B show a case in which the distance d2 of the lead frames is about 200 μm. As shown in FIGS. 11A and 11B, mutual interference occurs between heats emitted from the light emitting diodes 31 and 33 provided on one lead frame.

FIGS. 12A and 12B show a case in which the distance d3 of the light emitting diodes is about 250 μm. As shown in FIGS. 12A and 12B, mutual interference occurring between heats emitted from the light emitting diodes 31 and 33 provided on one lead frame is reduced as compared with the cases of FIGS. 10A to 11B. Regarding the thermal characteristic of the light emitting diodes 31 and 33, as a temperature is increased; mutual interference occurring between heats emitted from the light emitting diodes 31 and 33 is reduced. The distance d3 is set to a distance representing that the temperature characteristic of heats emitted from the light emitting diodes 31 and 33 is substantially identical to the thermal characteristic of heat emitted from one light emitting diode. Accordingly, the heat radiation in the light emitting diodes 31 and 33 can be effectively achieved. The mutual interference generated in a region of between the light emitting diodes 31 and 33 is decreased by the distance d3 between the light emitting diodes 31 and 33 as compared with the cases of FIGS. 12A to 12B.

FIGS. 13A and 13B show a case in which the distance d4 of the light emitting diodes is about 300 μm. As shown in FIGS. 13A and 13B, mutual interference rarely occurs between heats emitted from the light emitting diodes 31 and 33 provided on one lead frame as a temperature is raised. The mutual interference occurring between heats emitted from the light emitting diodes 31 and 33 provided on one lead frame is further reduced as compared with the cases of FIGS. 12A to 12B.

FIGS. 14A and 14B show a case in which the distance d5 of the light emitting diodes is about 500 μm. As shown in FIGS. 14A and 14B, mutual interference rarely occurs between heats emitted from the light emitting diodes 31 and 33 provided on one lead frame as a temperature is raised.

Figure 15:
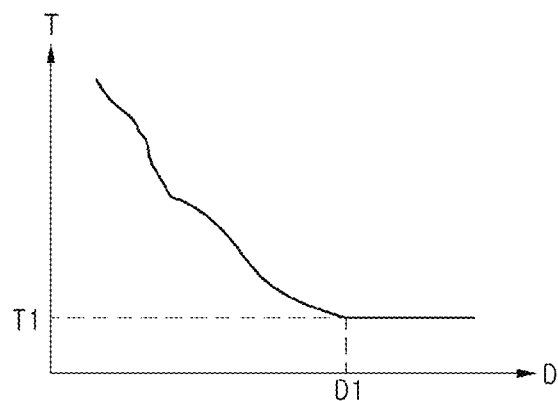
FIG. 15 is a graph showing a temperature distribution and the distance between light emitting diodes in the light emitting device package of FIG. 1.

FIG. 15 is a graph showing a temperature T as a function of a distance D between LEDs (Light Emitting Diodes) according to the embodiment.

Referring to FIG. 15, the distance D1 between the plurality of light emitting diodes according to the embodiment is set within the range of 250 μm±50 μm, and the temperature distribution (T1) of heats emitted from the light emitting diodes is identical or similar to the temperature distribution of heat emitted from one light emitting diode mounted on a lead frame by the distance D1 between the plurality of light emitting diodes.

According to the embodiment, the distance D1 between the light emitting diodes 31 and 33 is optimized, so that the reliability for the light emitting device package can be improved against heats emitted from the light emitting diodes 31 and 33.

A lens may be provided on the light emitting device package according to the embodiment. The lens may include a concave lens, a convex lens, a Fresnel lens, or the selective combination of concave and convex lenses. The light emitting device package may be integrated with the lens, or may be separated from the lens, but the embodiment is not limited thereto.

Figure 16:
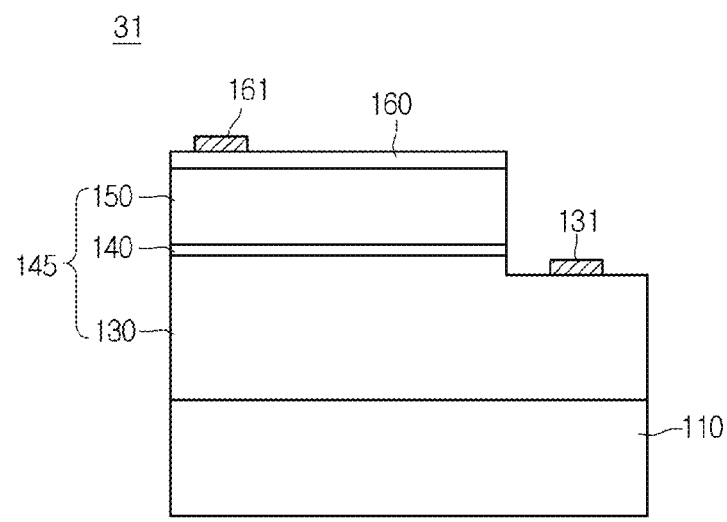
FIG. 16 is a view showing a light emitting diode according to the embodiment.

FIG. 16 is a view showing the LED of FIG. 1 according to the embodiment. The embodiment will be described while focusing on the first LED, and the description of the other LED will be omitted in order to avoid redundancy.

Referring to FIG. 16, the first LED 31 includes a substrate 110, a light emitting structure 145, a current spreading layer 160, a first electrode 131, and a second electrode 161.

The substrate 110 may include sapphire ($Al_2O_3$), Si, GaN, SiC, or GaAs, and the refractive index of the substrate 110 may include a material having a refractive index lower than a refractive index (2.4) of a nitride semiconductor. For example, the refractive index of the sapphire may be within the range of about 1.75 to about 1.76. The substrate 110 may include a conductive material or an insulating material. A concavo-convex structure may be formed on a top surface of the substrate 110.

A plurality of compound semiconductor layers may be formed on the substrate 110. The compound semiconductor layers may include group III-V compound semiconductors. For example, the compound semiconductor layers may include a compound semiconductor material having a compositional formula of $In_xAl_yGa_{1-x-y}N$ ($0 \leq x \leq 1$, $0 \leq y \leq 1$, and $0 \leq x+y \leq 1$).

An undoped semiconductor layer (not shown) may be formed on the substrate 110. Since the undoped semiconductor layer is not doped with conductive dopants, the undoped semiconductor layer has electrical conductivity remarkably lower than that of first and second conductive semiconductor layers 130 and 150. For example, the undoped semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the undoped semiconductor layer may include InAlGaN, GaN, AlGaN, InGaN, AlN, InN, or AlInN, but the embodiment is not limited thereto.

A buffer layer (not shown) may be additionally formed between the undoped semiconductor layer and the substrate 110 to reduce lattice constant different between the two layers. The lattice constant of the buffer layer (not shown) may be an intermediate value between the lattice constant of the substrate 110 and the lattice constant of the undoped semiconductor layer. In addition, the buffer layer (not shown) may include a semiconductor material having a compositional formula of $In_xAl_yGa_{1-x-y}N$ ($0 \leq x \leq 1$, $0 \leq y \leq 1$, $0 \leq x+y \leq 1$). For example, the buffer layer (not shown) may include InAlGaN, GaN, AlGaN, InGaN, AlN, InN, or AlInN, but the embodiment is not limited thereto. The buffer layer (not shown) may include a compound semiconductor of group II to VI elements, but the embodiment is not limited thereto.

None of the buffer layer (not shown) and the undoped semiconductor layer may be formed, or at least one of the buffer layer and the undoped semiconductor layer may be formed. However, the embodiment is not limited thereto.

The light emitting structure 145 has a structure in which a first conductive semiconductor layer 130, an active layer 140, and a second conductive semiconductor layer 150 are sequentially stacked. The first electrode 131 may be provided on the first conductive semiconductor layer 130, and the second electrode 161 may be provided on the second conductive semiconductor layer 150. The light emitting structure 145 receives power from the first and second electrodes 131 and 161 to generate light. The light emitting structure 145 may emit a blue, green, or blue light having a visible ray band or may emit a light having a UV band.

The first conductive semiconductor layer 130 may be provided on one of the substrate 110, the buffer layer, and the undoped semiconductor layer. The first conductive semiconductor layer 130 may include a group III-V compound semiconductor doped with a first conductive dopant. The first conductive semiconductor layer 130 may include an N type semiconductor layer. The N type semiconductor layer may include a semiconductor material having a compositional formula of $In_xAl_yGa_{1-x-y}N$ ($0 \leq x \leq 1$, $0 \leq y \leq 1$, and $0 \leq x+y \leq 1$). For example, the first conductive semiconductor layer 130 may include InAlGaN, GaN, AlGaN, InGaN, AlN, InN, or AlInN. The first conductive semiconductor layer 130 may be doped with N type dopants such as Si, Ge, Sn, C, Se, or Te.

The first conductive semiconductor layer 130 may include at least two layers having different thickness or different dopant concentrations, but the embodiment is not limited thereto.

The active layer 140 is formed on the first conductive semiconductor layer 130. The active layer 140 emits the light based on the band gap difference of the energy band according to material constituting the active layer 40 through the recombination of electrons (or holes) injected through the first conductive semiconductor layer 130 and holes (or electrons) injected through the second conductive semiconductor layer 150.

The active layer 140 may have at least one of a single quantum well structure, a multiple quantum well (MQW) structure, a quantum dot structure, or a quantum wire structure. The active layer 140 may have a structure in which a plurality of quantum well layers are alternately stacked with a plurality of quantum barrier layers. The quantum well layers and the quantum barrier layers have different energy band gaps. The active layer 140 may include a semiconductor material having a compositional formula of $In_xAl_yGa_{1-x-y}N$ ($0 \leq x \leq 1$, $0 \leq y \leq 1$, and $0 \leq x+y \leq 1$).

A clad layer (not shown) doped with N type dopants may be provided under the active layer 140, and a clad layer (not shown) doped with P type dopants may be provided above the active layer 140. The clad layer (not shown) may include a semiconductor, such as an AlGaN layer or an InAlGaN layer, having a band gap higher than that of the quantum barrier layer and/or the quantum well layer of the active layer 140.

The second conductive semiconductor layer 150 may be formed on the active layer 140. The second conductive semiconductor layer 150 may include a group III-V compound semiconductor layer doped with second conductive dopants. For example, the second conductive semiconductor layer 150 may include a P type semiconductor layer. The P type semiconductor layer may include a semiconductor material having a compositional formula of $In_xAl_yGa_{1-x-y}N$ ($0 \leq x \leq 1$, $0 \leq y \leq 1$, and $0 \leq x+y \leq 1$). The P type semiconductor layer may include InAlGaN, GaN, AlGaN, InGaN, AlN, InN, or AlInN. The P type semiconductor layer may be doped with P type dopants.

Meanwhile, the first conductive semiconductor layer may include P type dopants, and the second conductive semiconductor layer may include N type dopants, but the embodiment is not limited thereto. In addition, a third conductive semiconductor layer including N type dopants or P type dopants may be formed on the second conductive semiconductor layer 150. Accordingly, the LED may have at least one of N-P, P-N,N-P-N, and P-N-P junction structures. In this case, in the phrase of "N-P, P-N, N-P-N, and P-N-P junction structures", "N" and "P" represent an N type semiconductor layer and a P type semiconductor, respectively, and "-" represents the structure in which two layers are directly or indirectly stacked.

The light generated and emitted from the active layer 140 is discharged through a top surface and a lateral surface of the first LED 31. Although not shown, a concavo-convex structure or a roughness may be formed on the top surface and/or the lateral surface of the first LED 31 in order to improve light extraction efficiency.

The current spreading layer 160 may be additionally interposed between the second electrode 161 and the second conductive semiconductor layer 150 in order to improve the spreading of a current.

A light extraction structure such as a roughness may be additionally formed on a top surface of the substrate 110 and each layer, but the embodiment is not limited thereto.

The embodiment provides LEDs having a substrate shown in FIG. 16. The distance between the LEDs is within the range of about 250 μm+50 μm. Preferably, the distance between the LEDs may be within the range of about 220 μm to about 280 μm. The temperature distribution of heat generated from the LEDs is identical or similar to the temperature distribution of heat generated from one LED According to the embodiment, the distance between the LEDs is optimized, so that the reliability for the light emitting device package can be improved against heats generated from the LEDs.

Figure 17:
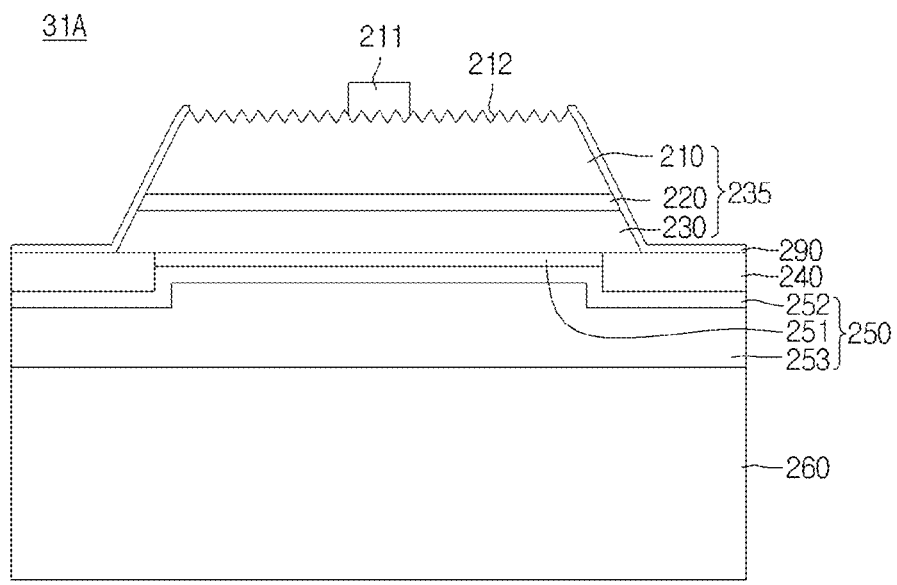
FIG. 17 is a view showing an example of a light emitting diode according to the embodiment.

FIG. 17 is a view showing a light emitting diode according to the embodiment. The embodiment will be described while focusing on the first LED, and the description of the other LED will be omitted in order to avoid redundancy.

Referring to FIG. 17, an first LED 31A includes a light emitting structure 235 having a plurality of compound semiconductor layers 210, 220, and 230, a protective layer 240, a plurality of conductive layers 250, a support member 260, an insulating layer 290, and an electrode 211.

The first LED 31A is an LED including a plurality of compound semiconductor layers of group III-V elements. The LED may include a color LED having a visible ray band to emit blue, red, or green light or a UV LED. The LED may include various LEDs within the technical scope of the embodiment.

The light emitting structure 235 includes a first conductive semiconductor layer 210, an active layer 220, and a second conductive semiconductor layer 230.

The first conductive semiconductor layer 210 may include compound semiconductors of group III-V elements doped with first conductive type dopants. For instance, the first conductive semiconductor layer 210 may include GaN, AlN, AlGaN, InGaN, InN, InAlGaN, AlInN, AlGaAs, GaP, GaAs, GaAsP, or AlGaTnP. If the first conductive semiconductor layer 210 is an N type semiconductor, the first conductive dopants may include an N type dopant such as Si, Ge, Sn, C, Se, or Te. The first conductive semiconductor layer 210 may have a single layer structure or a multi-layer structure, but the embodiment is not limited thereto.

The first conductive semiconductor layer 210 is provided on a top surface thereof with a light extraction structure such as a roughness and/or a pattern 212 for the purpose of light extraction efficiency or with a transparent electrode layer or an insulating layer for the purpose of current spreading and light extraction, but the embodiment is not limited thereto.

The first conductive semiconductor layer 210 includes a plurality of semiconductor layers, and the semiconductor layers may have different dopant concentrations, different thicknesses, or different compositional formulas.

The first conductive semiconductor layer 210 may have a superlattice structure (SLS) and may include one selected from the group consisting of GaN, InN, AlN, InGaN, AlGaN, InAlGaN, $SiO_2$, $SiO_x$, $SiN_2$, $SiN_x$, $SiO_xN_y$, and a metallic material. The superlattice structure includes at least two stack structures in which at least two layers are alternately repeated. For example, the superlattice structure includes a stack structure of InGaN/GaN. Each layer of the superlattice structure may have a thickness of at least a few Å.

The electrode 211 may be formed on the first conductive semiconductor layer 210. The electrode 211 may include a pad or an electrode pattern having a branch structure connected to the pad, but the embodiment is not limited thereto. A roughness pattern may be formed on the top surface of the electrode 211, but the embodiment is not limited thereto. A portion of the top surface of the first conductive semiconductor layer 210, at which the electrode 211 is formed, may be flat, but the embodiment is not limited thereto.

The electrode 211 may make ohmic contact with the top surface of the first conductive semiconductor layer 210, and may have a single layer structure or a multiple layer structure including one selected from the group consisting of Cr, Ti, Al, In, Ta, Pd, Co, Ni, Si, Ge, Ag, Cu, and Au and the alloy thereof. The electrode 211 may include one selected from the above material by taking into consideration ohmic contact with the first conductive semiconductor layer 210, the adhesive property between metallic layers, a reflective characteristic, and a conductive characteristic.

The active layer 220 may be formed under the first conductive semiconductor layer 210 and a multiple quantum well structure. In addition, the active layer 220 may have a quantum wire structure or a quantum dot structure. The active layer 220 may have a stack structure of well/barrier layers by using a compound semiconductor material of group III to V elements. For example, the active layer 220 may have the stack structure of InGaN well/GaN barrier layers, InGaN well/AlGaN barrier layers, or InGaN well/InGaN barrier layers, but the embodiment is not limited thereto.

For example, the active layer 220 may include a quantum well layer having a compositional formula of $In_xAl_yGa_{1-x-y}N$ ($0 \leq x \leq 1$, $0 \leq y \leq 1$, and $0 \leq x+y \leq 1$) and a barrier layer having a compositional formula of $In_xAl_yGa_{1-x-y}N$ ($0 \leq x \leq 1$, $0 \leq y \leq 1$, and $0 \leq x+y \leq 1$).

A conductive clad layer may be formed on and/below the active layer 220, and may include a nitride-based semiconductor. The bandgap of the barrier layer is higher than the bandgap of the well layer, and the bandgap of the conductive clad layer may be higher than the bandgap of the barrier layer.

The second conductive semiconductor layer 230 is formed under the active layer 220, and may include a compound semiconductor of a group III-V element doped with second conductive dopants. For example, the second conductive semiconductor layer 230 may include selected from the group GaN, AlN, AlGaN, InGaN, InN, InAlGaN, AlInN, AlGaAs, GaP, GaAs, GaAsP, and AlGaTnP. If the second conductive semiconductor layer is a P type semiconductor, the second conductive dopants include P type dopants such as Mg and Zn. The second conductive semiconductor layer 230 may have a single layer structure or a multiple layer structure, but the embodiment is not limited thereto.

The light emitting structure 235 may further include a third conductive semiconductor layer below the second conductive semiconductor layer 230. The third conductive semiconductor layer may have polarity opposite to the polarity of the second conductive semiconductor layer. In addition, the first conductive semiconductor layer 210 includes a P type semiconductor, and the second conductive semiconductor layer 210 includes an N type semiconductor. Accordingly, the light emitting structure 235 may include at least one of an N-P junction structure, a P-N junction structure, an N-P-N junction structure, and a P-N-P junction structure.

A protective layer 240 and a plurality of conductive layers 250 may be formed under the second conductive semiconductor layer 230 or the third conductive semiconductor layer. Hereinafter, a case in which the lower most layer of the light emitting structure 235 is the second conductive semiconductor layer 230 will be described for the purpose of explanation.

The protective layer 240 is provided at a channel region which is an outer region of a chip. The channel region serves as a chip peripheral region which forms a boundary of a chip. An outer portion of a top surface of the protective layer 240 may be exposed to the outside or may be covered by another material, for example, the insulating layer 290. A roughness or a pattern may be formed on the top surface of the protective layer 240. The protective layer 240 and the roughness or the pattern can improve light extraction efficiency in the channel region. The roughness or the pattern may include a material different from that of the protective layer 240 or a material having a refractive index different from that of the protective layer 240 at an outer portion of the top surface of the protective layer 240. The roughness or the pattern may include a group III-V compound semiconductor. For example, the roughness or the pattern may include one selected from the group consisting of GaN, AlN, AlGaN, InGaN, InN, InAlGaN, AlInN, AlGaAs, GaP, GaAs, GaAsP, and AlGaTnP. The roughness or the pattern may be formed by an isolation etching process for the second conductive semiconductor layer An inner portion of the top surface of the protective layer 240 makes contact with an outer portion of the lower surface of the second conductive semiconductor layer 230 by a predetermined width. In this case, the contact width is within the range of a few μm to a few tens μm, and may vary according to a chip size.

The protective layer 240 may be formed with a loop shape, a ring shape, or a frame shape at an outer peripheral portion of the lower surface of the second conductive semiconductor layer 230. The protective layer 240 may have a continuous pattern shape or a discontinuous pattern shape.

The protective layer 240 may include a material having a refractive index lower than that of a group III-V compound semiconductor. For example, the protective layer 240 may include a transmissive oxide material, a transmissive nitride material, a transmissive insulating material, or a transmissive conducting material. The protective layer 240 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

If the protective layer 240 includes $SiO_2$, the refractive index of the protective layer 240 is about 2.3. In addition, if the protective layer 240 includes ITO or GaN, the refractive index of the protective layer 240 is about 2.1 or about 2.4, respectively. Light incident to the protective layer 240 through the second conductive semiconductor layer 230 may be extracted to the outside, so that the light extraction efficiency can be improved.

The protective layer 240 protects the light emitting structure 235 from being shorted even if the outer wall of the light emitting structure 235 is exposed to the moisture. Accordingly, the LED strong against a great amount of moisture can be provided. If the protective layer 240 includes a transmissive material, a laser beam is transmitted through the protective layer 240 in a laser scribing process. Accordingly, the channel region prevents metal fragments from being created due to the laser beam. Therefore, the interlayer short problem occurring on the sidewalls of the light emitting structure 235 can be prevented.

The protective layer 240 spaces the outer wall of each layer 210, 220, or 230 of the light emitting structure 235 from a first conductive layer 251. The protective layer 240 may have a thickness within the range of about 0.02 μm to about 5 μm. The thickness of the protective layer 240 may vary according to the chip sizes.

The conductive layers 250 include first to third conductive layers 251, 252, and 253, and the first conductive layer 251 makes ohmic contact with the second conductive semiconductor layer 230. The first conductive layer 251 may have a multiple layer structure including a conductive oxide material selected from the group consisting of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, or may have a stack structure of IZO/Ni, AZO/Ag, IZO/Ag/Ni, or AZO/Ag/Ni.

The first conductive layer 251 may additionally include one selected from the group consisting of $SiO_2$, $SiO_x$, $SiO_xN_y$, $Si_3N_4$, $Al_2O_3$, and $TiO_2$. The first conductive layer 251 may be interposed between the first conductive layer 251 and the second conductive semiconductor layer 230.

The first conductive layer 251 may be provided on the lower surface of the second conductive semiconductor layer 230. In addition, the first conductive layer 251 may cover a portion of the lower surface of the protective layer 240. In other words, the first conductive layer 251 may have an area corresponding to at most 80% of the width of the protective layer 240 at the portion of the lower surface of the protective layer 240.

The second conductive layer 252 is provided below the first conductive layer 251. The second conductive layer 252 may extend to the lower surface of the protective layer 240. The first conductive layer 251 may include reflective metal and/or seed metal, and the seed metal is used for the plating process. Accordingly, the first conductive layer 251 may selectively include an ohmic layer, a seed layer, or a reflective layer, but the embodiment is not limited thereto.

The second conductive layer 252 may have a single layer structure or a multiple layer structure including one selected from the group consisting of Ag, Ni, Al, Rh, Pd, Ir, Ru, Mg, Zn, Pt, Au, Hf, and the combination thereof.

The third conductive layer 253 is formed below the second conductive layer 252. The third conductive layer 253 includes barrier metal or bonding metal. For example, the third conductive layer 253 may include at least one selected from the group consisting of Ti, Au, Sn, Ni, Cr, Ga, In, Bi, Cu, Ag, and Ta.

The third conductive layer 253 serves as a bonding layer, so that a lower surface of the third conductive layer 253 is bonded to a support member 260. The support member 260 may be attached to the second conductive layer 252 through a plating process or by using a sheet without forming the third conductive layer 253.

The support member 260 serves as a base substrate, and may include one selected from the group consisting of copper (Cu), gold (Au), nickel (Ni), molybdenum (Mo), copper-tungsten (Cu—W), and a carrier wafer such as Si, Ge, GaAs, ZnO, SiC, SiGe, and GaN.

The support member 260 may be electrically connected to the first lead frame of FIG. 1, and the electrode 211 may be electrically connected to the second lead frame by using a wire. The heat transferred from the support member 260 is transferred to the first lead frame 21A, so that heat radiation efficiency can be improved. Accordingly, the reliability for the light emitting diode 31A can be improved.

The outer surface of the light emitting structure 235 may be inclined and may include an insulating layer 290. A lower end of the insulating layer 290 may partially make contact with the top surface of the protective layer 240 or may cover the entire portion of the top surface of the protective layer 240. The insulating layer 290 may include a material having a refractive index (e.g., 2.4 in the case of GaN) lower than that of the compound semiconductor. For example, the insulating layer 290 may include one selected from the group consisting of $SiO_2$, $SiO_x$, $SiO_xN_y$, $Si_3N_4$, $Al_2O_3$, and $TiO_2$.

As shown in FIG. 17, the embodiment provides LEDs having a support member. The distance between the LEDs is within the range of 250 μm±50 μm. Preferably, the distance between the LEDs may be within the range of about 200 μm to about 250 μm by the conductive support member. The temperature distribution of heat generated from the LEDs mounted on the first lead frame is identical or similar to the temperature distribution of heat generated from one LED mounted on a lead frame. According to the embodiment, the distance between the LEDs is optimized, so that the reliability for the light emitting device package can be improved against heats generated from the LEDs.

<Lighting System>

A plurality of light emitting device packages according to the embodiment are arrayed on a board. A light guide plate, a prism sheet, and a diffusion sheet constituting an optical member may be provided on the path of the light of the light emitting device packages. The light emitting device package, the board, and the optical member may constitute a light unit. The light unit is realized in a top view type or a side view type and provided in a portable terminal and a lap top computer. A light emitting device or light emitting device package according to an embodiment may be applied to a light unit. The light unit may include a structure in which a plurality of light emitting devices or light emitting device packages are arrayed, and may include lightings, traffic lights, vehicle headlights, and electronic display boards.

Figure 18:
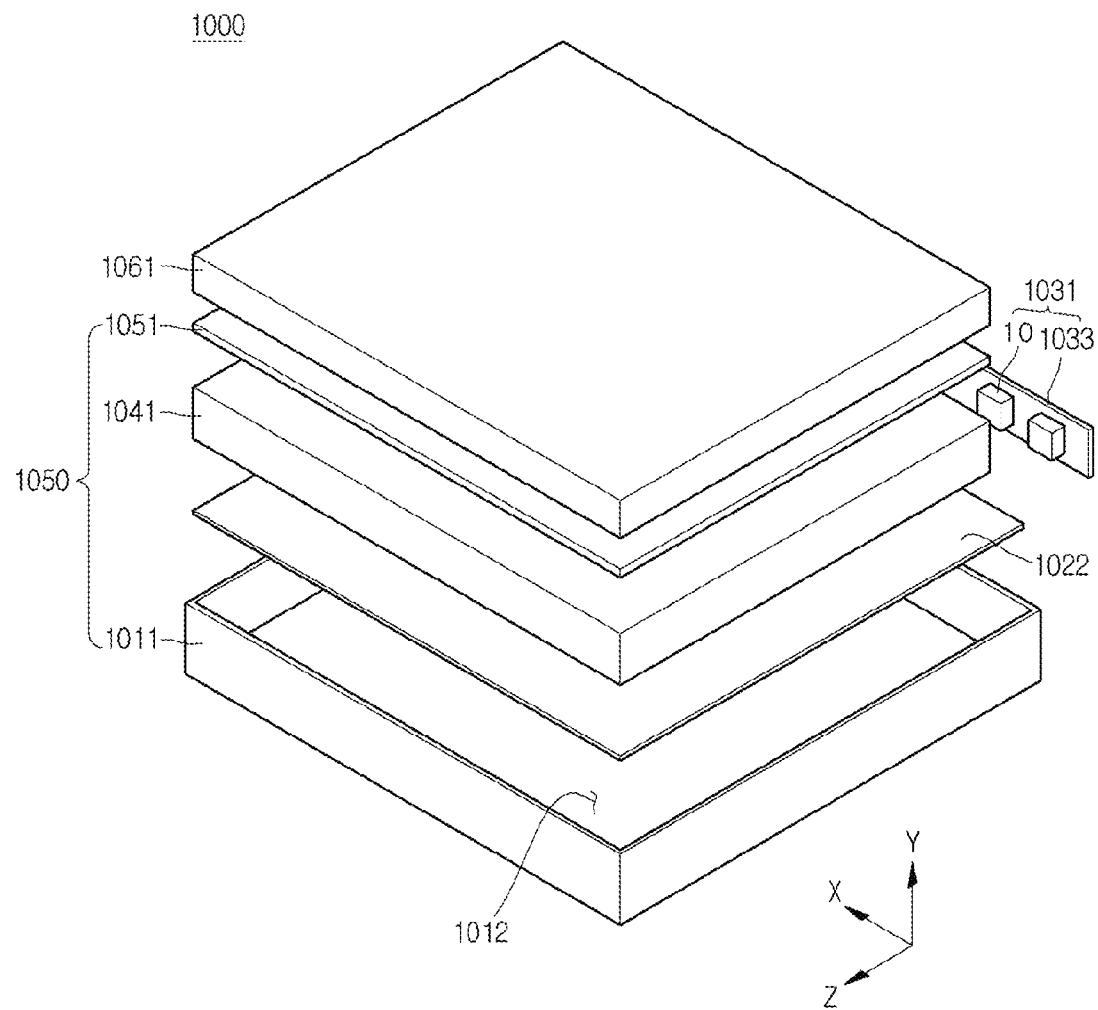
FIG. 18 is a view showing a display apparatus according to the embodiment.
Figure 19:
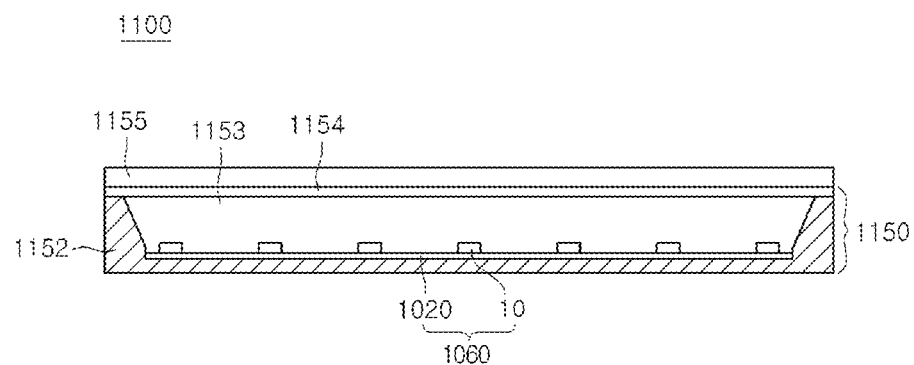
FIG. 19 is a view showing another example of the display apparatus according to the embodiment.
Figure 20:
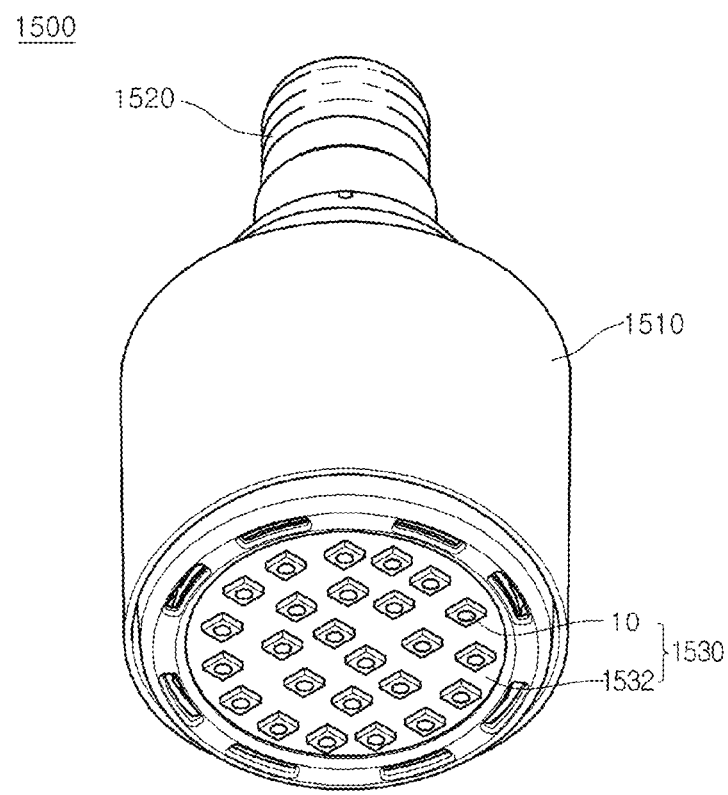
FIG. 20 is a view showing a lighting apparatus according to the embodiment.

The lighting system may include a display apparatus shown in FIGS. 18 and 19, a lighting device shown in FIG. 20, in addition to a lighting lamp, a signal light, a vehicle headlight, an electronic display, etc.

FIG. 18 is a disassembled perspective view of a display apparatus according to an embodiment.

Referring to FIG. 18, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 10 according to embodiments disclosed above, and the light emitting device packages 10 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 10 is mounted on a side surface or a heat releasing plate, the board 1033 may be removed. Herein, some of the heat releasing plate may contact an upper surface of the bottom cover 1011.

The plurality of light emitting device packages 10 may be mounted on the board 1033 such that light emitting surfaces of the plurality of light emitting device packages 10 are spaced apart by a predetermined distance from the light guide panel 1041, but the present disclosure is not limited thereto. The light emitting device package 10 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or non-metallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

FIG. 19 is a cross-sectional view of a display apparatus according to an embodiment.

Referring to FIG. 19, the display apparatus 1100 includes a bottom cover 1152, a board 1120 on which the light emitting device packages 10 disclosed above are arrayed, an optical member 1154, and a display panel 1155.

The board 1120 and the light emitting device package 10 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

FIG. 20 is a perspective view of a lighting device according to an embodiment.

Referring to FIG. 20, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 10 according to the embodiments mounted on the board 1532. The light emitting device package 10 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 10 may be mounted on the board 1532. Each of the light emitting device packages 10 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CR1).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, heat radiation characteristics can be improved in the light emitting device package having LEDs. According to the embodiment, the reliability for a package having a plurality of LEDs can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a body;
a first lead frame on the body;
a second lead frame spaced apart from the first lead frame on the body;
a plurality of light emitting diodes on the first lead frame; and
a molding member on the plurality of light emitting diodes,
wherein the plurality of light emitting diodes includes a first light emitting diode and a second light emitting diode,
wherein the first and second light emitting diodes are spaced apart from each other, wherein a first distance between the first light emitting diode and the second light emitting diode is a range of 200 μM to 300 μM and has a range of A1/4 to A1, wherein A1 is a length of a first side of the first light emitting diode, wherein the first lead frame and the second lead frame are electrically connected to the plurality of the light emitting diodes, wherein the molding member contacts the plurality of light emitting diodes, wherein the plurality of light emitting diodes include one of a blue LED chip, a green LED chip, a red LED chip and a UV LED chip, wherein the first lead frame has a thickness of range of about 0.1 mm to 0.5 mm, wherein the body includes an upper portion thereof with a cavity having an open upper portion, and the first lead frame, the plurality of light emitting diodes, and the molding member are in the cavity, wherein the light emitting diodes on the first lead frame are three or less, and wherein the first distance between the first light emitting diode and the second light emitting diode decreases mutual interference by heat generated from the first and second light emitting diodes.

2. The light emitting device package of claim 1, wherein the first side of the first light emitting diode and a second side of the second light emitting diode face each other, and
wherein the length of the first side is identical to a length of the second side.

3. The light emitting device package of claim 2, wherein A1 has a shorter length than a length of a second side adjacent to the first side of the first light emitting diode and has a shorter length than a length of a first side adjacent to the second side of the second light emitting diode.

4. The light emitting device package of claim 1, wherein the first side of the first light emitting diode has a length of at least 250 μm, and
wherein the first distance between the first light emitting diode and the second light emitting diode is less than the length of the first side of the first light emitting diode.

5. The light emitting device package of claim 1, wherein the first light emitting diode has a different size as the second light emitting diode.

6. The light emitting device package of claim 1, further comprising a third light emitting diode disposed on the second lead frame,
wherein the third light emitting diode is closer to the first light emitting diode than the second light emitting diode, and
wherein a second distance between the first light emitting diode and the third light emitting diode is greater than the first distance.

7. The light emitting device package of claim 1, wherein the plurality of light emitting diodes includes a third light emitting diode disposed on the first lead frame,
wherein a distances among the first, second and third light emitting diodes are identical to each other, and
wherein the first light emitting diode has a smallest size of the plurality of light emitting diodes.

8. The light emitting device package of claim 1, wherein the first side of the first light emitting diode has a length of 250 μm to 1200 μm, and
wherein the first side has a shorter length than a length of another side of the first light emitting diode.

9. The light emitting device package of claim 1, wherein the first and second light emitting diodes is the blue LED chip and the molding member includes a phosphor,
wherein the first side of the first light emitting diode has a length of 250 μm to 1200 μm,
wherein the first side has a shorter length than a length of another side of the first light emitting diode,
wherein a surface of the cavity has a polygonal shape,
wherein each of the plurality of light emitting diodes includes a conductive support member, a light emitting structure having a plurality of semiconductor layers on the conductive support member, and an electrodes on the light emitting structure,
wherein the light emitting structure is disposed between the conductive support member and the electrode, and
wherein the first distance is a distance representing a temperature characteristic of heat emitted from the first and second light emitting diodes that is substantially identical to a thermal characteristic of heat emitted from one of the first light emitting diode and the second light emitting diode.

10. A light emitting device package, comprising:
a body including a cavity having an open upper portion;
first and second lead frames in the cavity of the body;
a first light emitting diode on the first lead frame;
a second light emitting diode on the first lead frame, the second light emitting diode spaced apart from the first light emitting diode with a first distance;
an adhesive agent adhered between the first, second and third light emitting diodes and the first lead frame; and
a molding member covering the first and second light emitting diodes,
wherein the first lead frame and the second lead frame are electrically connected to the first and second light emitting diodes,
wherein the molding member is contacted with the plurality of light emitting diodes,
wherein the first and second light emitting diodes include one of a blue LED chip, a green LED chip, a red LED chip and a UV LED chip,
wherein the first light emitting diode has a first side having a first length and a second side having a second length shorter than the first length of the first side, and
wherein the first distance is a range of 200 μm to 300 μm and has a range of A1/4 to A1, wherein A1 is the second length of the second side of the first light emitting diode,
wherein the first lead frame has a thickness of range of about 0.1 mm to 0.5 mm,
wherein the light emitting diodes on the first lead frame are three or less,
wherein the first distance between the first light emitting diode and the second light emitting diode decreases mutual interference by heat generated from the first and second light emitting diodes, and
wherein the first distance is a distance representing a temperature characteristic of heat emitted from the first and second light emitting diodes that is substantially identical to a thermal characteristic of heat emitted from one of the first light emitting diode and the second light emitting diode.

11. The light emitting device package of claim 10, wherein the first and second lead frames extend to a lateral surface and a lower surface of the body.

12. The light emitting device package of claim 10, wherein the first length of the first side of the first light emitting diode is at least 250 μm.

13. The light emitting device package of claim 10, wherein the first light emitting diode has a different size from a size of the second light emitting diode.

14. A light emitting device package, comprising:
a body;
a first lead frame on the body;
a second lead frame spaced apart from the first lead frame on the body;
a plurality of light emitting diodes on the first lead frame;
an adhesive agent adhered between each of the plurality of light emitting diodes and the first lead frame; and
a molding member on the plurality of light emitting diodes,
wherein the plurality of light emitting diodes includes a first light emitting diode, a second light emitting diode and a third light emitting diode arranged in at least two rows,
wherein the first, second and third light emitting diodes are spaced apart from each other,
wherein the first and second light emitting diodes are disposed in a first row on the first lead frame,
wherein the third light emitting diode is disposed in a second row spaced apart from the first row on the first lead frame,
wherein a first distance between the first light emitting diode and the second light emitting diode has a range of A1/4 to A1, wherein A1 is a length of a first side of the first light emitting diode,
wherein a second distance between the first light emitting diode and the third light emitting diode is a same or different distance from the first distance,
wherein the first distance is a range of 250 μm±50 μm,
wherein the second distance is a range of 250 μm±50 μm,
wherein a third distance between the third light emitting diode and the second light emitting diode is about 250 μM±50 μm,
wherein the first lead frame and the second lead frame are electrically connected to the plurality of the light emitting diodes,
wherein the molding member contacts the plurality of light emitting diodes,
wherein the plurality of light emitting diodes include one of a blue LED chip, a green LED chip, a red LED chip and an UV LED chip, and
wherein A1 is a length of a short side of sides of the first light emitting diode,
wherein all of the light emitting diodes emit a light of the same color,
wherein the first lead frame has a thickness of range of about 0.1 mm to 0.5 mm,
wherein the body is formed of one of a silicon material, a ceramic material, and a resin material,
wherein the body includes an upper portion thereof with a cavity having an open upper portion, and the first lead frame, the plurality of light emitting diodes, and the molding member are in the cavity,
wherein the light emitting diodes on the first lead frame are three or less,
wherein the first distance between the first light emitting diode and the second light emitting diode decreases mutual interference by heat generated from the first and second light emitting diodes, and
wherein the first distance is a distance representing a temperature characteristic of heat emitted from the first and second light emitting diodes that is substantially identical to a thermal characteristic of heat emitted from one of the first light emitting diode and the second light emitting diode.

15. The light emitting device package of claim 14, wherein a distances among the first, second and third light emitting diodes are identical to each other.

16. The light emitting device package of claim 14, wherein the first side of the first light emitting diode has a length of at least 250 μm.

17. The light emitting device package of claim 14, wherein the first, second and third light emitting diodes are the blue LED chip and the molding member includes a phosphor.

18. The light emitting device package of claim 14, wherein the first light emitting diode has a different size from a size of the second light emitting diode.

19. The light emitting device package of claim 14, wherein the first, second and third light emitting diodes have the same size, and wherein the first distance is different from the second distance.

20. The light emitting device package of claim 14,
wherein the first side is a short side of the first light emitting diode, and
wherein the first and second light emitting diodes have a different size from each other.

21. The light emitting device package of claim 14, wherein each of the plurality of light emitting diodes includes a conductive support member, a light emitting structure having a plurality of semiconductor layers on the conductive support member, and an electrodes on the light emitting structure, and
wherein the light emitting structure is disposed between the conductive support member and the electrode.

* * * * *